United States Patent
Qin et al.

(10) Patent No.: US 9,391,133 B2
(45) Date of Patent: Jul. 12, 2016

(54) CAPACITOR AND PREPARATION METHOD THEREOF

(75) Inventors: Rengang Qin, Jiangsu (CN); Dejin Wang, Jiangsu (CN); Boyong He, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/130,439

(22) PCT Filed: Aug. 2, 2012

(86) PCT No.: PCT/CN2012/079553
§ 371 (c)(1),
(2), (4) Date: Apr. 21, 2014

(87) PCT Pub. No.: WO2013/023528
PCT Pub. Date: Feb. 21, 2013

(65) Prior Publication Data
US 2014/0231893 A1    Aug. 21, 2014

(30) Foreign Application Priority Data
Aug. 12, 2011    (CN) .......................... 2011 1 0232289

(51) Int. Cl.
*H01L 49/02* (2006.01)
*H01L 21/02* (2006.01)
*C23C 16/34* (2006.01)

(52) U.S. Cl.
CPC .............. *H01L 28/75* (2013.01); *C23C 16/345* (2013.01); *H01L 21/022* (2013.01); *H01L 21/0217* (2013.01); *H01L 21/02164* (2013.01); *H01L 21/02271* (2013.01); *H01L 28/40* (2013.01)

(58) Field of Classification Search
CPC .............. H01L 28/75; H01L 21/02164; H01L 21/0217; H01L 21/022; H01L 21/02271; H01L 28/40; C23C 16/345
See application file for complete search history.

(56) References Cited

U.S. PATENT DOCUMENTS

| | | | |
|---|---|---|---|
| 5,789,289 A | 8/1998 | Jeng | |
| 6,093,585 A | 7/2000 | Randazzo | |
| 6,492,224 B1 | 12/2002 | Jao | |
| 6,797,557 B2 | 9/2004 | Chiang | |
| 2006/0110889 A1* | 5/2006 | Dornisch et al. | 438/396 |

FOREIGN PATENT DOCUMENTS

CN     1149658 C     5/2004

* cited by examiner

*Primary Examiner* — Long Pham
(74) *Attorney, Agent, or Firm* — Muncy, Geissler, Olds & Lowe, P.C.

(57) ABSTRACT

A capacitor and a method of fabricating thereof are provided. A structure of low pressure tetraethyl orthosilicate—low pressure silicon nitride—low pressure tetraethyl orthosilicate is used in the capacitor to replace the oxide-nitride-oxide structure of the existing capacitor; the capacitor has a relatively high unit capacitance value. Furthermore, the structure of low pressure tetraethyl orthosilicate—low pressure silicon nitride—low pressure tetraethyl orthosilicate is fabricaited by low pressure chemical vapor deposition method at relatively low temperature; thus the heat produced in the whole process is relatively low, which is insufficient to make the semiconductor device shift or make the gate metal layer or the metallized silicon layer peel off. Accordingly, the capacitor and the method of fabricating the capacitor of the present invention can be well applied in the process of the 0.5 μm PIP capacitor or below 0.5 μm.

9 Claims, 4 Drawing Sheets

CAPACITOR AND PREPARATION METHOD THEREOF

FIELD OF THE INVENTION

The present disclosure relates to a capacitor and a method of fabricating the capacitor, more particularly relates to a poly-insulator-poly capacitor and method of fabricating the capacitor.

BACKGROUND OF THE INVENTION

In the current fabrication of large scale integrated circuit, the poly-insulator-poly (PIP) capacitor is widely used. In the popular process of 0.5 μm Mix PIP, a Low Pressure Tetraethyl Orthosilicate (LPTEOS) is commonly used as an intermediate insulating layer. However, the unit capacitance value of this capacitor is only 0.72 fF/μm$^2$, i.e. 0.72×10$^{-15}$ F/μm$^2$, which has been a factor of restricting the chip integration level; thus the method of fabricating a capacitor with a higher unit capacitance value has become a hotspot of this industry.

Two methods are proposed to improve the capacitance value of the PIP-type capacitor. One is to make the LPTEOS layer with a thickness of about 400 angstroms become thinner, however, the breakdown voltage of the thinner capacitor is significantly lowered, which is unfavorable to the application of the device. The other is to look for another insulation layer structure to replace the conventional LPTEOS layer.

The Oxide-Nitride-Oxide (ONO) capacitor with a high capacitance value has been widely used. FIG. 1 shows a cross-sectional view of the existing ONO capacitor. As shown in FIG. 1, from bottom to top, the ONO capacitor 10 successively includes: a first polycrystalline silicon 11, which is used as the lower conductive plate of the ONO capacitor; an intermediate dielectric layer 12 with a sandwich structure, the intermediate dielectric layer 12 includes: a first oxide layer 121 disposed on the first polycrystalline silicon 11, a nitride layer 122 disposed on the first oxide layer 121, and a second oxide layer 123 disposed on the nitride layer 122; and a second polycrystalline silicon 13, which is used as the upper conductive plate of the ONO capacitor. The unit capacitance value of this type ONO structure capacitor is more than 1.61 fF/μm$^2$, which is an ideal semiconductor capacitor. However, when this type of ONO structure capacitor is applied in the process of the 0.5 μm PIP capacitor or below 0.5 μm, there are some drawbacks, which mainly includes: firstly, the fabrication step of the sandwich structure includes: growing the first oxide layer 121 on the first polycrystalline silicon 11 by dry oxidation. Specifically, the substrate material is placed in a high temperature diffusion furnace at a temperature of 900° C., then a high-purity oxygen gas is introduced, the oxidation lasts for 70 minutes to 90 minutes; then the silicon nitride layer 122 is deposited on the first oxide layer 121 by low pressure chemical vapor deposition method; a deposition temperature is 700° C. to 800° C.; finally, the second oxide layer 123 is grown on the silicon nitride layer 122 by wet oxidation. Specifically, a water vapor is formed by the combustion of high-purity oxygen and hydrogen, and the surface of the silicon nitride oxide 122 is oxidized; a oxidation temperature is 920° C., the oxidation lasts for 100 minute to 140 minutes. It can be seen that a high temperature treatment is needed for fabricating the three layer materials, a large amount of heat will be produced in the whole process, all the devices are suffered from shifting in varying degrees. Secondly, the first polycrystalline silicon 11, used as the lower conductive plate, is usually shared with the gate of the MOS transistor. According to the conventional processing technology of the MOS transistor, a metal layer or a metallized silicon layer is required to be formed on the polysilicon gate layer; the metal layer or the metallized silicon layer easily peels off after being treated in a high temperature for a long time. Take the tungsten silicide as an example, in the condition of introducing of oxygen, the tungsten silicide easily peels off from the polycrystalline silicon when the temperature exceeds 800° C.; accordingly, the quality of the whole device is effected.

Accordingly, developing a capacitor having a high unit capacitance value, and its fabrication can be applied to the 0.5 μm capacitor or below 0.5 μm, is urgently needed to solve the problem.

SUMMARY OF THE INVENTION

Accordingly to this, the present disclosure is directed to a capacitor and a method of fabricating the capacitor. The capacitor has a higher unit capacitance value. In the method of fabricating the capacitor, the overall heat produced in the process of fabricating the intermediate dielectric layer is relatively low; which is insufficient to make the semiconductor device shift or make the gate metal layer or the metallized silicon layer peel off.

One object of the present invention is to provide a capacitor, which includes an upper conductive plate, a lower conductive plate, and an intermediate dielectric layer; the intermediate dielectric layer includes a first low pressure tetraethyl orthosilicate layer disposed on the lower conductive plate, a low pressure silicon nitride layer disposed on the first low pressure tetraethyl orthosilicate layer, and a second low pressure tetraethyl orthosilicate layer disposed on the low pressure silicon nitride layer.

Alternatively, the lower conductive plate is a first polysilicon layer; the upper conductive plate is a second polysilicon layer.

Alternatively, the lower conductive plate further includes a metal layer or a metallized silicon layer disposed between the first polysilicon layer and the first low pressure tetraethyl orthosilicate layer.

Alternatively, the metal layer or the metallized silicon layer is made of one selected from the group consisting of aluminum, tungsten, and tungsten silicide.

Alternatively, the capacitor is disposed on a semiconductor substrate having a gate oxide layer and a gate layer, the lower conductive plate of the capacitor is the gate layer of the semiconductor substrate.

Another object of the present invention is to provide a method of fabricating a capacitor, which includes the steps:

1) providing a semiconductor substrate, forming a gate oxide layer and a gate polysilicon layer successively on the semiconductor substrate, wherein the gate polysilicon layer is used as a lower conductive plate of the capacitor;

2) depositing a first low pressure tetraethyl orthosilicate layer on the gate polysilicon layer by low pressure chemical vapor deposition method;

3) depositing a low pressure silicon nitride layer on the first low pressure tetraethyl orthosilicate layer by low pressure chemical vapor deposition method;

4) depositing a second low pressure tetraethyl orthosilicate layer on the silicon nitride layer by low pressure chemical vapor deposition method;

5) depositing a second polysilicon layer on the second low pressure tetraethyl orthosilicate layer by low pressure chemical vapor deposition method; the second polysilicon layer is used as an upper conductive plate of the capacitor.

Alternatively, the method further includes:

depositing a metal layer or a metallized silicon layer between the gate polysilicon layer and the first low pressure tetraethyl orthosilicate layer.

Alternatively, the metal layer or the metallized silicon layer is made of one selected from the group consisting aluminum, tungsten, and tungsten silicide.

Alternatively, a deposition temperature of the first tetraethyl orthosilicate layer and the second tetraethyl orthosilicate layer is 620° C.

Alternatively, a deposition temperature of the silicon nitride layer is 700° C.

Alternatively, after the step of 5), the method further includes:

etching and removing the second polysilicon layer, the first low pressure tetraethyl orthosilicate layer, the low pressure silicon nitride layer, and the second low pressure tetraethyl orthosilicate layer which are disposed outside of a capacitance area.

Alternatively, when a metal layer or a metallized silicon layer is disposed between the gate polysilicon layer and the first low pressure tetraethyl orthosilicate layer, the method further includes:

removing the metal layer or the metallized silicon layer which is disposed outside of a capacitance area.

In the foregoing capacitor, the structure of low pressure tetraethyl orthosilicate—low pressure silicon nitride—low pressure tetraethyl orthosilicate is used to replace the structure of the Oxide-Nitride-Oxide of the existing ONO capacitor, thus the capacitor in the present disclosure has relatively high unit capacitance value. In addition, the structure of low pressure tetraethyl orthosilicate—low pressure silicon nitride—low pressure tetraethyl orthosilicate is fabricaited by low pressure chemical vapor deposition method at relatively lower temperature, thus the heat produced in the whole process is relatively low, which is insufficient to make the semiconductor device shift or make the gate metal layer or the metallized silicon layer peel off. Accordingly, the capacitor and the method of fabricating the capacitor of the present invention can be well applied in the process of the 0.5 μm PIP capacitor or below 0.5 μm.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

As described in the background section, if a LPTEOS layer is used as the dielectric layer in the PIP capacitor, the unit capacitance value of this capacitor cannot meet these requirements of the semiconductor integrated process. The ONO structure capacitor has a high unit capacitance value, however, a high temperature treatment is needed for fabricating the three layer materials, a large amount of heat is produced in the whole process, all the devices are shifted in different degrees. Moreover, a metal layer or a metallized silicon layer is required to be disposed on the polysilicon gate layer in the technology of the MOS transistor, the metal layer or the metallized silicon layer easily peels off; thus the quality of the whole device is effected.

According to this, a new capacitor and a method of fabricating the capacitor are provided in the present disclosure, the capacitor has a higher unit capacitance value. Furthermore, the overall heat produced in the fabricating process is much lower than that of the existing ONO structure capacitor; accordingly, the effect on the semiconductor device is reduced because the heat is lowered during the overall fabricating process of the semiconductor.

Embodiments of the present invention will be described in detail with reference to the accompanying drawings.

Figure 1:
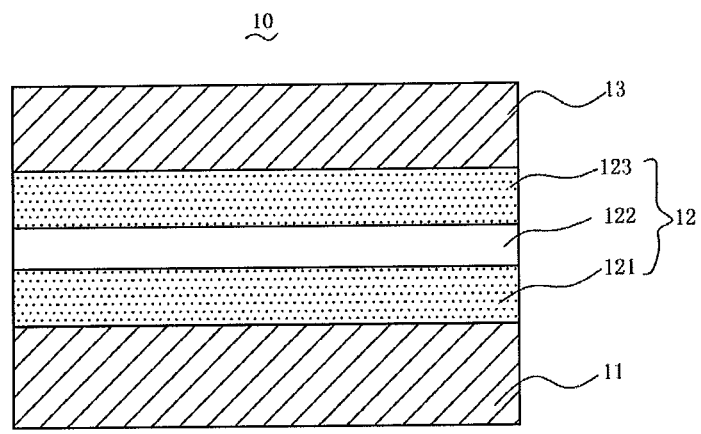
FIG. 1 is a cross-sectional view of a conventional ONO structure capacitor.
Figure 2:
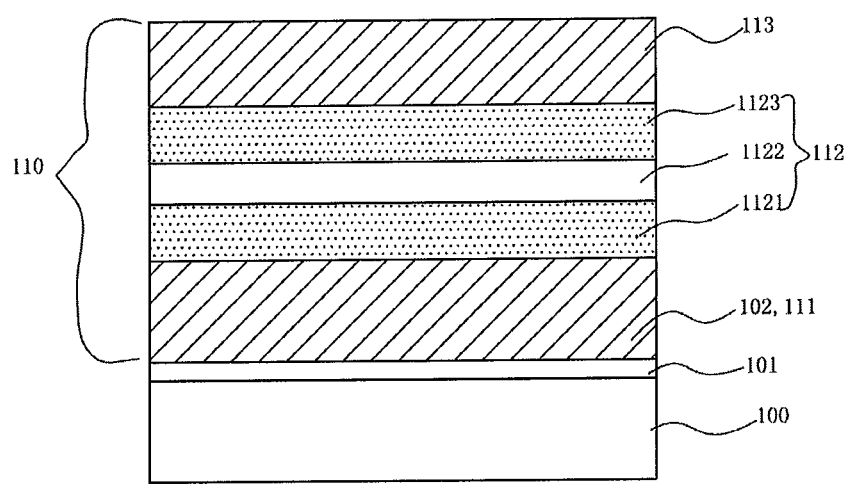
FIG. 2 is a cross-sectional view of the capacitor of the present disclosure.

FIG. 2 is a schematic view of the capacitor of the present disclosure. As shown in the FIG. 2, a capacitor 110 is formed on a semiconductor substrate 100 having a gate oxide layer 101 and a gate polysilicon layer 102. The capacitor 110 includes a lower conductive plate 111 formed of a first polycrystalline silicon layer, an upper conductive plate 113 formed of a second polycrystalline silicon layer, and an intermediate dielectric layer 112. The intermediate dielectric layer 112 is consisted of a first low pressure tetraethyl orthosilicate layer 1121 disposed on the lower conductive plate 111, a low pressure silicon nitride layer 1122 disposed on the first low pressure tetraethyl orthosilicate layer 1121, and a second low pressure tetraethyl orthosilicate layer 1123 disposed on the low pressure silicon nitride layer 1122. The first polycrystalline silicon layer of the lower conductive plate 111 is the gate polysilicon layer 102 on the substrate 100.

Figure 3A:
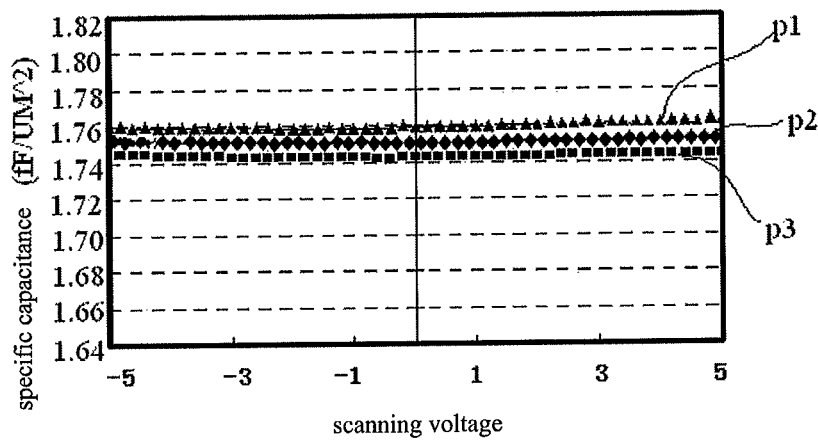
FIG. 3A through 3B are a C-V diagram and a B-V diagram of the capacitor by measuring the different points on a surface, respectively.
Figure 3B:
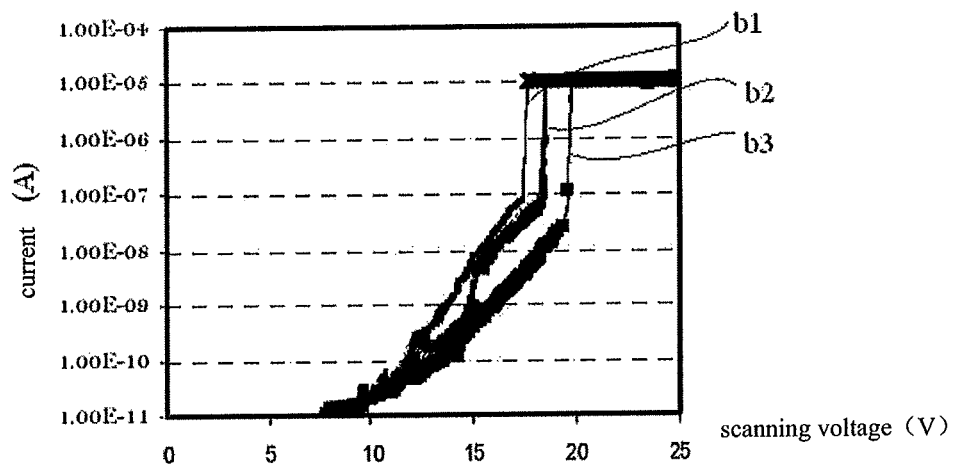

FIG. 3A though 3B show a C-V diagram and a B-V diagram of the capacitor by measuring the different points on a surface. Referring to 3A, the x axis represents the applied sweep voltage, the y axis represents the unit capacitance value. p1, p2, and p3 represent the curves of the unit capacitance value depending on the voltage by measuring three different points on the upper conductive plate 113. It can be seen that the average unit capacitance value of the capacitor 110 exceeds 1.7 fF/um^2, which is more than 2 times compared with the common PIP capacitor. Referring to FIG. 3B, the x axis represents the sweep voltage, the y axis represents the current. b1, b2, and b3 represent the BV curves by performing the breakdown test of different points on the capacitor, it can be seen that the breakdown voltage of the capacitor is more than 15V, which means the capacitor has an excellent breakdown voltage.

Figure 4:
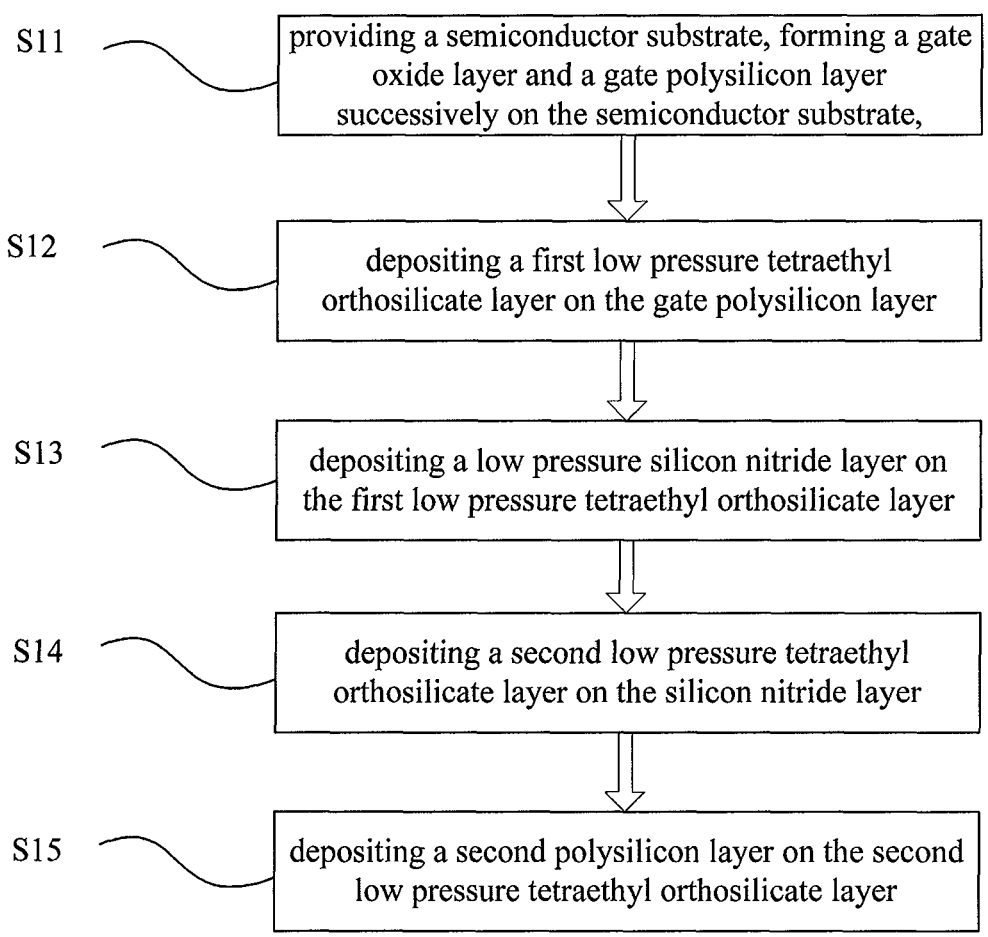
FIG. 4 is a flow chart of a method of fabricating a capacitor of the present disclosure.

FIG. 4 shows a flow chart of a method of fabricating the capacitor. It can be seen from FIG. 4 that the method includes the steps:

Step S11, a semiconductor substrate is provided, then a gate oxide layer and a gate polysilicon layer are successively formed on the semiconductor substrate. The semiconductor substrate can be made of monocrystalline silicon, polycrystalline silicon, or amorphous silicon. Alternatively, it can be made of germanium silicon compound or silicon gallium compound. Alternatively, the semiconductor substrate may include an epitaxial layer or the silicon on insulator (SOI).

The gate oxide can be made of silicon oxide and silicon oxynitride. A thickness of the gate oxide is 5 nm to 100 nm. The silicon oxide is formed by one method selected from the group consisting of furnace oxidation, rapid thermal annealing oxidation, and water vapor oxidation. The silicon oxide can be treated by a nitriding process to form a silicon oxynitride; the silicon oxynitride is formed by one method selected from the group consisting of furnace nitridation, rapid thermal annealing nitridation, and plasma nitridation.

The gate polycrystalline silicon layer is the lower conductive plate 111 of the capacitor 100, the gate polysilicon layer is formed on the gate oxide layer by chemical vapor deposition or atomic layer deposition. In the illustrated embodiment, the gate polysilicon layer is formed by low pressure chemical vapor deposition method. Specifically, a plurality of semiconductor substrates are vertically placed in the deposition furnace, the furnace is evacuated, and then the nitrogen is introduced and the semiconductor substrates are heated in the 3-zone resistance-heated furnace. The deposition gas is introduced when the temperature reaches about 620° C. and the pressure is maintained at about 270 mTorr. The deposition gas is silane. The flow of the deposition gas is controlled at a speed about 40cc/min. The impurities can be doped to the gate polysilicon layer to reduce the resistivity. The doping of the polysilicon gate layer can be performed by ion implantation process or in-situ doping deposition process.

Step S12, a first low pressure tetraethyl orthosilicate layer is deposited on the gate polySilicon layer by low pressure chemical vapor deposition method. Specifically, a plurality of semiconductor substrates are vertically placed in the deposition furnace, the furnace is evacuated, and then the nitrogen is introduced and the semiconductor substrates are heated in the 3-zone resistance-heated furnace. The deposition gas is introduced when the temperature reaches about 700° C. and the pressure is maintained at about 210 mTorr. The deposition gas is tetraethoxysilane. Since the tetraethoxysilane is liquid at the room temperature, the tetraethoxysilane is introduced to the furnace by a carrier gas of nitrogen. The partial pressure and flow of the tetraethoxysilane are controlled by the temperature of the tetraethoxysilane bottle and the flow of the nitrogen passing through the bottle, respectively. In general, the flow of the gas is controlled at a speed about 50cc/min.

Step S13: a low pressure silicon nitride layer is deposited on the first low pressure tetraethyl orthosilicate layer after the depositing of the first low pressure tetraethyl orthosilicate layer. The low pressure silicon nitride layer is also deposited by low pressure chemical vapor deposition method. The deposition gas is a mixture of $NH_3$ and $SiH_2Cl_2$; the silicon nitride reacted of these gases has advantages of higher quality, less by-products, excellent thickness uniformity and so on; and the flow of the gas is precisely controlled, which is the method in general use at present. The deposition temperature is usually about 700° C., the deposition time is 30 minutes to 60 minutes.

Step S14: a second low pressure tetraethyl orthosilicate layer is deposited on the low pressure silicon nitride layer after the depositing of the low pressure silicon nitride layer. The second low pressure tetraethyl orthosilicate layer is also deposited by low pressure chemical vapor deposition method. The specific deposition process is the same as the first low pressure tetraethyl orthosilicate layer, which will not be described in details.

Step S15: a second polysilicon layer is deposited on the second low pressure tetraethyl orthosilicate layer after the depositing of the second low pressure tetraethyl orthosilicate layer. The second polysilicon layer is used as the upper conductive plate 113 of the capacitor 110. The deposition of the second polysilicon layer is the same as that of the gate polysilicon layer, which will not be described in details.

The process of fabricating capacitor 110 is completed after the depositing of the upper conductive plate 113. The intermediate dielectric layer 112 is a structure of low pressure tetraethyl orthosilicate layer—low pressure silicon nitride—low pressure tetraethyl orthosilicate layer, during the fabricating, the intermediate dielectric layer is formed by low pressure chemical vapor deposition method, the heat produced in the process is relatively low, which is insufficient to make the semiconductor device shift or make the gate metal layer or the metallized silicon layer peel off, thus it can be well applied in the process of 0.5 µm PIP capacitor or below 0.5 µm.

Figure 5:
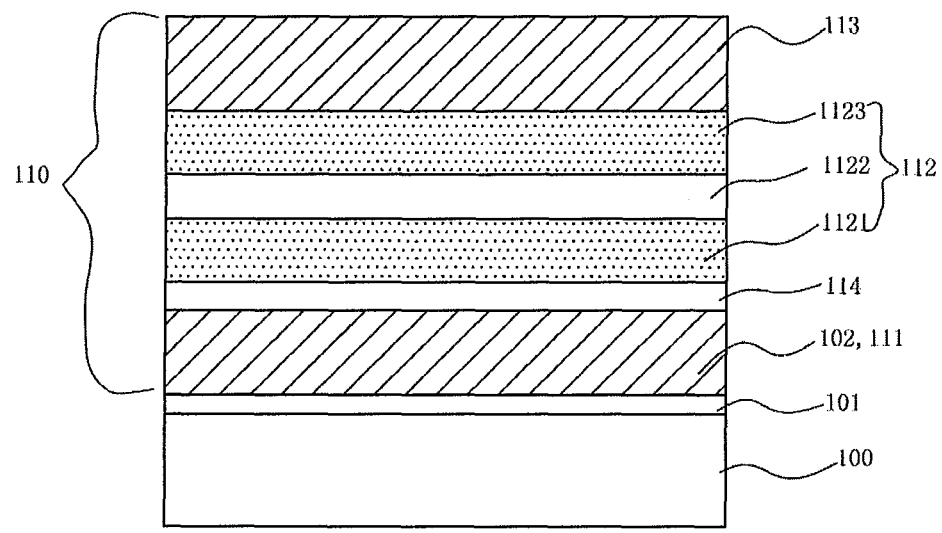
FIG. 5 is a cross-sectional view of the capacitor having a metal layer or a metallized silicon layer on a gate layer.

Particularly, FIG. 5 shows a cross-sectional view of the capacitor having a metal layer or a metallized silicon layer on a gate layer. In the semiconductor process, when a metal layer or a metallized silicon layer is needed to be deposited on a gate polysilicon layer, a layer of the metal layer or the metallized silicon layer 114 is deposited on the gate polysilicon layer 102 after the depositing of the gate polysilicon layer 102. The metal layer or the metallized silicon layer 114 forms a gate layer of the semiconductor substrate or the lower conductive plate of the capacitor with the gate polysilicon layer. The metal layer or the metallized silicon layer is made of one selected from the group consisting of aluminum, tungsten, and tungsten silicide. Take the tungsten silicide as an example, during the fabricating of the low pressure tetraethyl orthosilicate layer—low pressure silicon nitride—low pressure tetraethyl orthosilicate layer, first of all, no oxygen is introduced; secondly, the various layers are formed by low pressure chemical vapor deposition method, the temperature is not up to the peeling off temperature of the tungsten silicide. Compared with the ONO structure of the conventional capacitor, a capacitor with a higher quality can be obtained from the method of fabricating the capacitor is provided in the present disclosure.

Furthermore, in the process of fabricating the capacitor of the present invention integrated to the semiconductor, the method further includes a process of etching to remove the first low pressure tetraethyl orthosilicate layer, the low pressure silicon nitride layer, and the second low pressure tetraethyl orthosilicate layer which are disposed outside of a capacitance area. Specifically. A photoresist layer is spin coated on the second polysilicon layer by using a mask, then the photoresist layer is exposed, developed and etched away except which is deposited in the capacitance area, and the second polysilicon layer is exposed on those area. The exposed second polysilicon layer is etched by dry etching until the second tetraethyl orthosilicate layer is exposed. Then the exposed second tetraethyl orthosilicate layer can continue to be etched by dry etching or wet etching until the low pressure silicon nitride layer is exposed. The silicon nitride layer and the first tetraethyl orthosilicate layer continue to be etched in the same way until those layers are removed. Particularly, when a metal layer or a metallized silicon layer is disposed between the gate polysilicon layer and the first low pressure tetraethyl orthosilicate layer, the method further includes removing the metal layer or the metallized silicon layer outside of the capacitance area. It should be note that, in the method of fabricating the capacitor, the structure of the tetraethyl orthosilicate—silicon nitride—tetraethyl orthosilicate is used as the intermediate dielectric layer, the material of the layers do not effect the forming of other semiconductor devices; accordingly, in the etching, only a single mask process is required to remove all of the tetraethyl orthosilicate—silicon nitride—tetraethyl orthosilicate layer outside of the capacitance area. Compared with the existing ONO structure capacitor, multiple mask processes is omitted.

In the foregoing capacitor, the structure of low pressure tetraethyl orthosilicate—low pressure silicon nitride—low pressure tetraethyl orthosilicate is used to replace the structure of the Oxide-Nitride-Oxide of the existing ONO capacitor; thus the capacitor in the present disclosure has a higher unit capacitance value. Furthermore, the structure of low pressure tetraethyl orthosilicate—low pressure silicon nitride—low pressure tetraethyl orthosilicate is fabricaited by low pressure chemical vapor deposition method at relatively low temperature; thus the heat produced in the whole process is relatively low, which is insufficient to make the semiconductor device shift or make the gate metal layer or the metallized silicon layer peel off. Accordingly, the capacitor and the method of fabricating the capacitor of the present invention can be well applied in the process of the 0.5 µm PIP capacitor or below 0.5 µm.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A capacitor, comprising:
    an upper conductive plate, a lower conductive plate, and an intermediate dielectric layer; wherein the intermediate dielectric layer comprises:
    a first low pressure tetraethyl orthosilicate layer disposed on the lower conductive plate;
    a low pressure silicon nitride layer disposed on the first low pressure tetraethyl orthosilicate layer; and
    a second low pressure tetraethyl orthosilicate layer disposed on the low pressure silicon nitride layer, wherein the second low pressure tetraethyl orthosilicate layer is disposed below the upper conductive plate, wherein the capacitor provides a capacitance of at least 1.7 fF/µm$^2$.

2. The capacitor according to claim 1, wherein the lower conductive plate is a first polysilicon layer, the upper conductive plate is a second polysilicon layer.

3. The capacitor according to claim 2, wherein the lower conductive plate further comprises a metal layer or a metallized silicon layer disposed between the first polysilicon layer and the first low pressure tetraethyl orthosilicate layer.

4. The capacitor according to claim 3, wherein the metal layer or the metallized silicon layer is made of one selected from the group consisting of aluminum, tungsten, and tungsten silicide.

5. The capacitor according to claim 1, wherein the capacitor is disposed on a semiconductor substrate having a gate oxide layer and a gate polysilicon layer, the lower conductive plate of the capacitor is the gate polysilicon layer on the semiconductor substrate.

6. A capacitor, comprising:
    an upper conductive plate, a lower conductive plate, and an intermediate dielectric layer; wherein the intermediate dielectric layer comprises:
    a first low pressure tetraethyl orthosilicate layer disposed on the lower conductive plate;
    a low pressure silicon nitride layer disposed on the first low pressure tetraethyl orthosilicate layer; and
    a second low pressure tetraethyl orthosilicate layer disposed on the low pressure silicon nitride layer, wherein the second low pressure tetraethyl orthosilicate layer is disposed below the upper conductive plate, wherein the capacitor maintains charge for voltages in excess of 15 volts.

7. The capacitor of claim 1, wherein the total width of all layers of the capacitor is less than 0.5 µm.

8. The capacitor of claim 6, wherein the total width of all layers of the capacitor is less than 0.5 µm.

9. A capacitor, comprising:
    an upper conductive plate, a lower conductive plate, and an intermediate dielectric layer; wherein the intermediate dielectric layer comprises:
    a first low pressure tetraethyl orthosilicate layer disposed on the lower conductive plate;
    a metal layer or a metallized silicon layer disposed the first low pressure tetraethyl orthosilicate layer;
    a low pressure silicon nitride layer disposed on the metal layer or a metallized silicon layer; and
    a second low pressure tetraethyl orthosilicate layer disposed on the low pressure silicon nitride layer and disposed below the upper conductive plate.

* * * * *